United States Patent
Paek et al.

(10) Patent No.: US 7,632,742 B2
(45) Date of Patent: Dec. 15, 2009

(54) SUBSTRATE FOR GROWING PENDEO EPITAXY AND METHOD OF FORMING THE SAME

(75) Inventors: Ho-sun Paek, Suwon-si (KR); Tae-hoon Jang, Seoul (KR); Youn-joon Sung, Yongin-si (KR); Tan Sakong, Suwon-si (KR); Min-ho Yang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 83 days.

(21) Appl. No.: 11/650,981

(22) Filed: Jan. 9, 2007

(65) Prior Publication Data

US 2007/0190755 A1    Aug. 16, 2007

(30) Foreign Application Priority Data

Feb. 16, 2006    (KR) ...................... 10-2006-0015154

(51) Int. Cl.
*H01L 21/20* (2006.01)

(52) U.S. Cl. ........................ 438/479; 438/222; 438/245; 438/269; 438/481; 257/E21.09; 257/E21.097; 257/E21.108; 257/E21.133

(58) Field of Classification Search ................. 438/222, 438/245, 269, 481; 257/E21.09, E21.097, 257/E21.108, E21.133
See application file for complete search history.

(56) References Cited

U.S. PATENT DOCUMENTS

| 6,121,121 A * | 9/2000 | Koide .......................... 438/481 |
| 6,261,929 B1 * | 7/2001 | Gehrke et al. ............... 438/478 |
| 6,521,514 B1 | 2/2003 | Gehrke et al. |

OTHER PUBLICATIONS

Zheleva et al., "Pendeo-Epitaxy: A New Approach for Lateral Growth of Gallium Nitride Films," 1999, Journal of Electronic Materials, vol. 28, No. 4, pp. L5-L8.*

* cited by examiner

*Primary Examiner*—Alexander G Ghyka
*Assistant Examiner*—Leonard Chang
(74) *Attorney, Agent, or Firm*—Cantor Colburn LLP

(57) ABSTRACT

A Pendeo-epitaxy growth substrate and a method of manufacturing the same are provided. The Pendeo-epitaxy growth substrate includes a substrate, a plurality of pattern areas formed on the substrate in a first direction for Pendeo-epitaxy growth, and at least one solution blocking layer contacting the plurality of pattern areas and formed on the substrate in a second direction, thereby preventing contamination of a semiconductor device due to air gaps and reducing the percentage defects of the semiconductor device during a Pendeo-epitaxy growth process.

12 Claims, 8 Drawing Sheets

SUBSTRATE FOR GROWING PENDEO EPITAXY AND METHOD OF FORMING THE SAME

CROSS-REFERENCE TO RELATED PATENT APPLICATION

This application claims the benefit of Korean Patent Application No. 10-2006-0015154, filed on 16 Feb. 2006, in the Korean Intellectual Property Office, the disclosure of which is incorporated herein in its entirety by reference.

BACKGROUND OF THE DISCLOSURE

1. Field of the Disclosure

The present disclosure relates to a substrate for growing a semiconductor device, and more particularly, to a Pendeo-epitaxy growth substrate on which a solution blocking layer for preventing a flow of solution that may cause contamination of a semiconductor device during a manufacturing process of the semiconductor device is formed, and a method of manufacturing the same.

2. Description of the Related Art

Semiconductor devices, e.g., nitride semiconductor laser diodes, are manufactured by forming nitride semiconductor layers on sapphire ($Al_2O_3$) substrates. Sapphire substrates utilize a simple preprocessing process and are stable at high temperatures at which nitride semiconductor layers are formed. However, since sapphire substrates and nitride semiconductor layers have differences with respect to a lattice constant and a coefficient of expansion, sapphire substrates may have a crystal defect and may be easily deformed. GaN substrates having a low defect density are manufactured by forming thick GaN layers on sapphire substrates using hydride vapor phase epitaxy (HVPE). However, the HVPE lacks reliability in terms of defect density and size. To replace the HVPE, eptitaxial lateral overgrowth (ELOG) and Pendeo are proposed to reduce the defect density by using lateral growth. A Pendeo-epitaxy growth process is disclosed in U.S. Pat. No. 6,521,514.

Figure 1A:
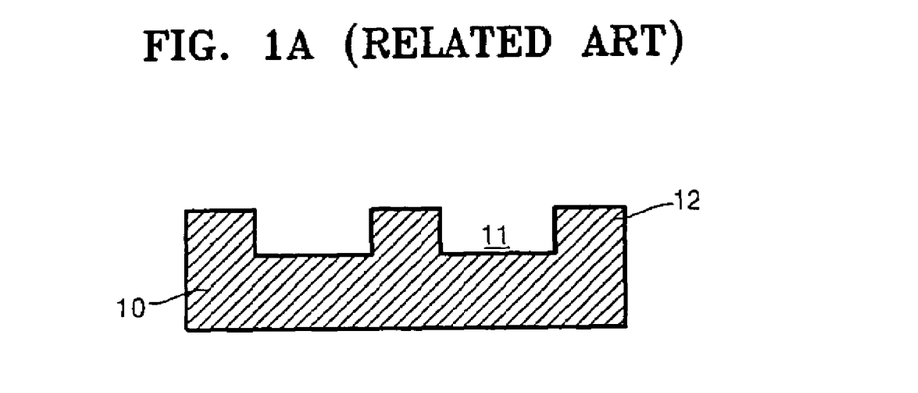
FIGS. 1A through 1C are cross-sectional views of a Pendeo-epitaxy growth substrate undergoing a conventional process of formation.
Figure 1B:
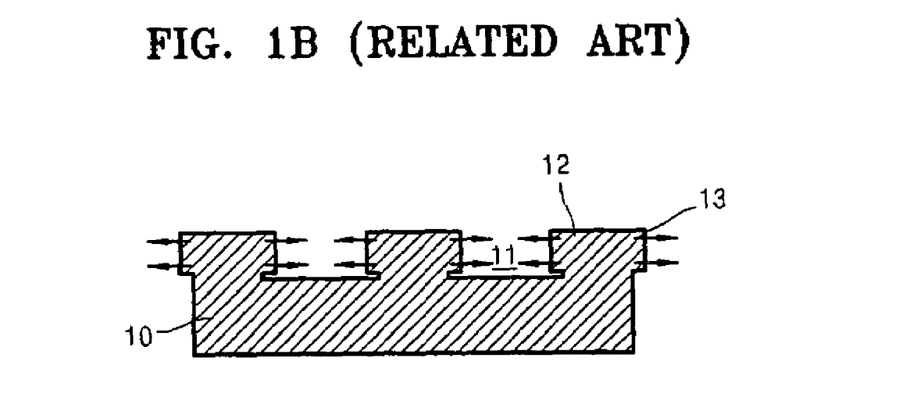
Figure 1C:
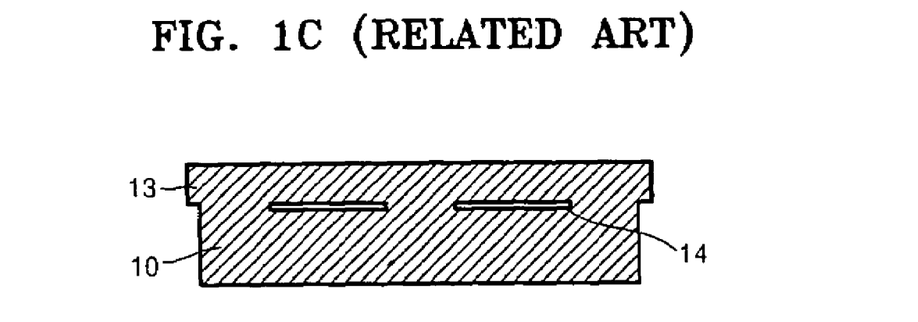

FIGS. 1A through 1C are cross-sectional views of a Pendeo-epitaxy growth substrate while undergoing a conventional process of formation. The process involves forming a GaN substrate using Pendeo-epitaxy growth.

Referring to FIG. 1A, a substrate 10 is coated with nitride and is partially etched to form an etching area 11 that exposes a portion of the facet of the substrate 10 and a pattern area 12.

Referring to FIG. 1B, if the nitride is laterally grown from the pattern area 12, growth areas 13 are grown laterally outward from the pattern area 12.

Referring to FIG. 1C, if the growth areas 13 keep growing, all the growth areas 13 are combined to complete a nitride layer. As a result, a crystal defect primarily occurs in the pattern area 12, and the growth areas 13 have a very low defect density. However, air gaps 14 generated at the bottom of the growth areas 13 are movement paths for various kinds of solutions during the manufacturing process of the substrate 10. Such solutions are combined with Ga melt to form a mixture. The mixture is physically splashed during the manufacturing process of a semiconductor device (e.g., during cleaving), which causes a phenomenon as illustrated in FIG. 2O. If the mixture adheres to the entire facet of the substrate 10, the substrate 10 cannot properly send an electric current but instead another path sends the electric current, which greatly reduces the yield of the semiconductor device manufacture.

Figure 2A:
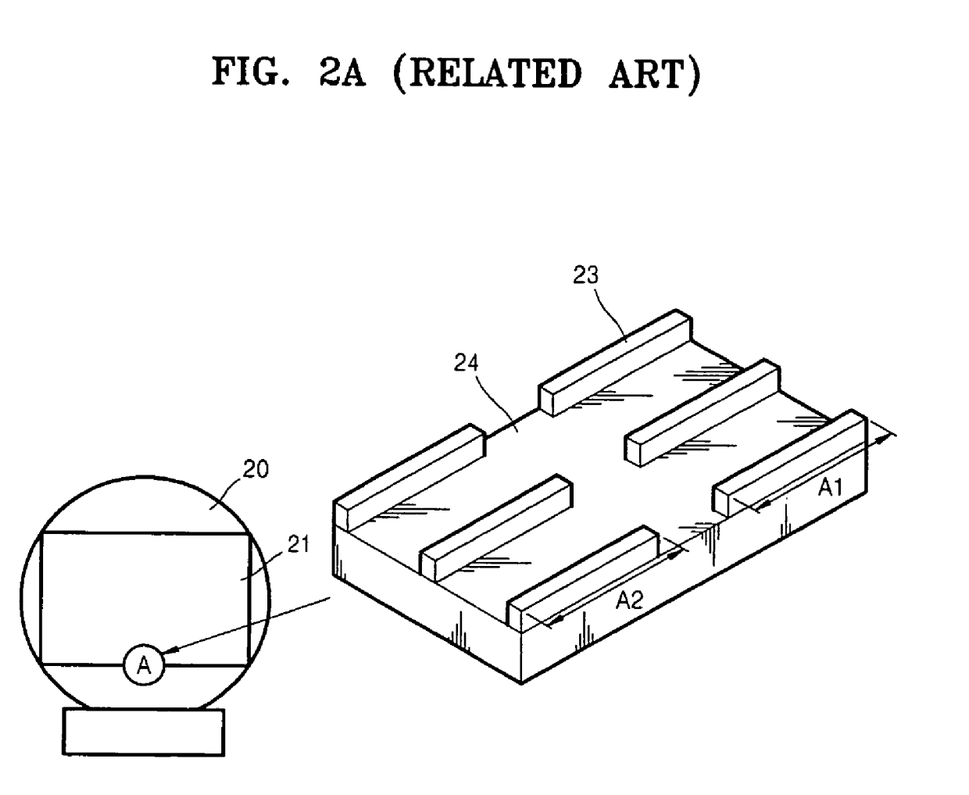
FIG. 2A is a diagram of a wafer used in a conventional Pendeo-epitaxy forming process.

FIG. 2A is a diagram of a wafer used in a conventional Pendeo-epitaxy forming process. Referring to FIG. 2A, all the areas of a substrate 20 are not used except for a usable area 21 which is inside the substrate 20. In an expanded boundary A of the usable area 21, pattern areas 23 and an etching area 24 are formed on the substrate 20. The pattern areas 23 are divided into usable areas A1 and unusable areas A2 after the semiconductor device is manufactured. The etching area 24 is removed from areas between the usable areas A1 and the unusable areas A2 in order to prevent a crack from occurring during a laser diode (LD) structure growth process.

Figure 2B:
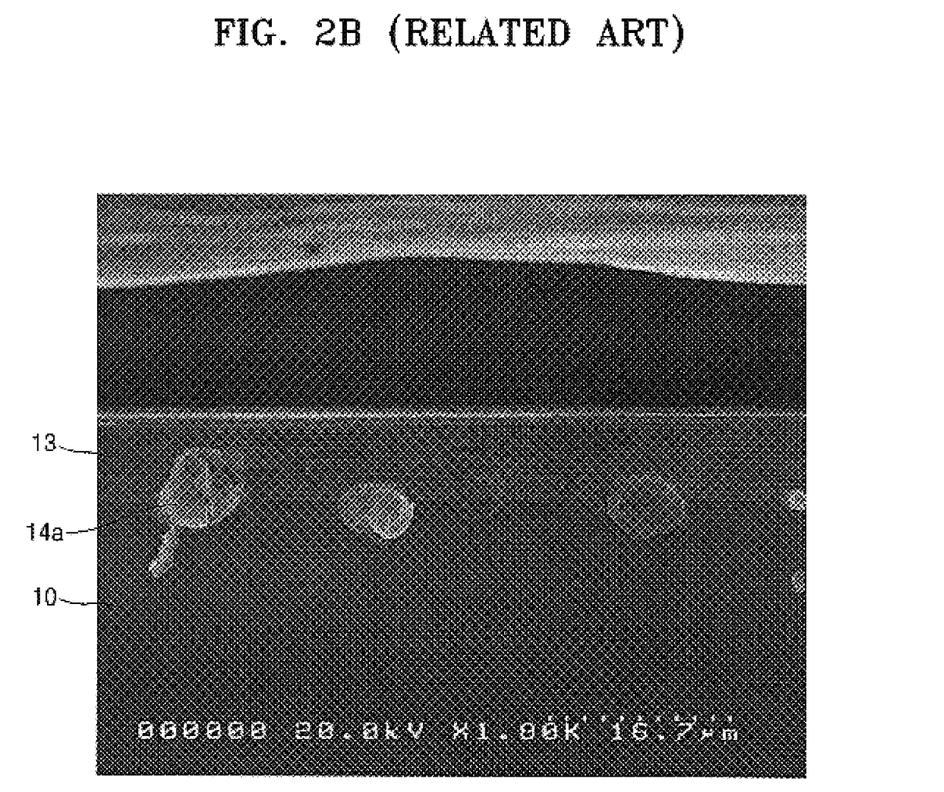
FIGS. 2B and 2C are cross-sectional images of a conventional semiconductor device after the semiconductor device is grown by a Pendeo-epitaxy process.
Figure 2C:
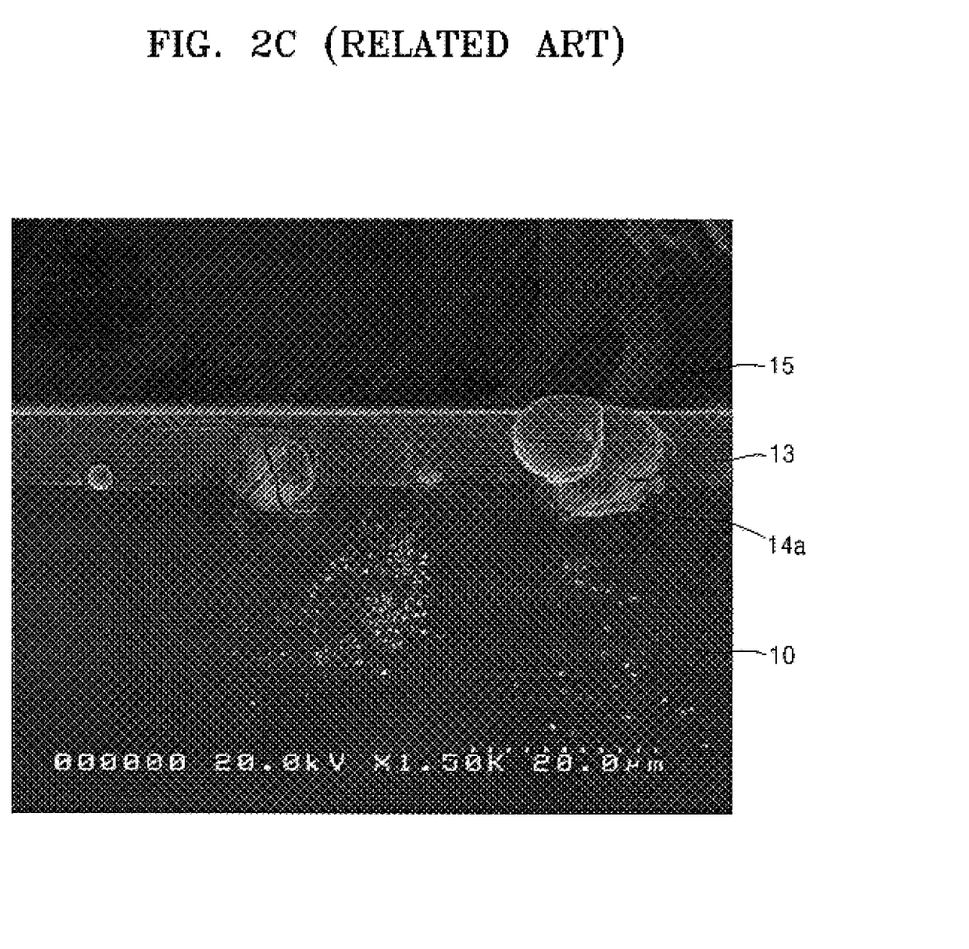

FIGS. 2B and 2C are cross-sectional images of a conventional semiconductor device after the semiconductor device is grown by a Pendeo-epitaxy process. Referring to FIGS. 2B and 2C, after the semiconductor device is formed on the substrate formed using the Pendeo-epitaxy process, large contamination areas 14a are generated in air gap areas of the substrate due to contamination of solution during the manufacturing process of the semiconductor device. The contamination areas 14a are frequently generated due to a solution being splashed during a cleaving process after forming growth areas 13 on the substrate and after forming a semiconductor layer 15 at the top of the growth areas 13. As described above, since the air gaps are indispensable to the Pendeo-epitaxy growth process, a method of preventing contamination of the air gaps and a yield reduction is required.

SUMMARY OF THE DISCLOSURE

The present invention may provide a Pendeo-epitaxy growth substrate having a new structure to prevent a semiconductor-device from being contaminated due to air gaps during a nitride semiconductor layer growth process.

The present invention also may provide a method of manufacturing a Pendeo-epitaxy growth substrate having a new structure to prevent a semiconductor device from being contaminated due to air gaps.

According to an aspect of the present invention, there may be provided a Pendeo-epitaxy growth substrate comprising: a substrate; a plurality of pattern areas formed on the substrate in a first direction for Pendeo-epitaxy growth; and at least one solution blocking layer contacting the plurality of pattern areas and formed on the substrate in a second direction.

The first direction and the second direction may be orthogonal to each other.

The substrate may be formed of sapphire, silicon carbide, silicon, or ZnO.

The pattern areas and the solution blocking layer may be formed of group III nitrides, such as GaN, AlGaN, InGaN, or AlInGaN.

The first direction may be a direction <1-100>, and the second direction may be a direction <11-20>.

The solution blocking layer may contact edges of the pattern areas.

According to an aspect of the present invention, there is provided a method of forming a Pendeo-epitaxy growth substrate, the method comprising: coating group III nitrides on a substrate and forming a nitride layer; disposing a mask having openings corresponding to a plurality of pattern areas formed on the substrate in a first direction for Pendeo-epitaxy growth and at least one solution blocking layer contacting the plurality of pattern areas and formed on the substrate in a second direction on the nitride layer; and etching the nitride layer excluding the pattern areas and the solution blocking layer and removing the etched nitride layer.

BRIEF DESCRIPTION OF THE DRAWINGS

The above and other features and advantages of the present invention will be described in detailed exemplary embodiments thereof with reference to the attached drawings in which.

DETAILED DESCRIPTION OF EXEMPLARY EMBODIMENTS

The present invention will now be described more fully with reference to the accompanying drawings, in which exemplary embodiments of the invention are shown. In the drawings, the thicknesses of layers and regions are exaggerated for clarity. Like reference numerals in the drawings denote like elements, and thus their description will be omitted.

Figure 3:
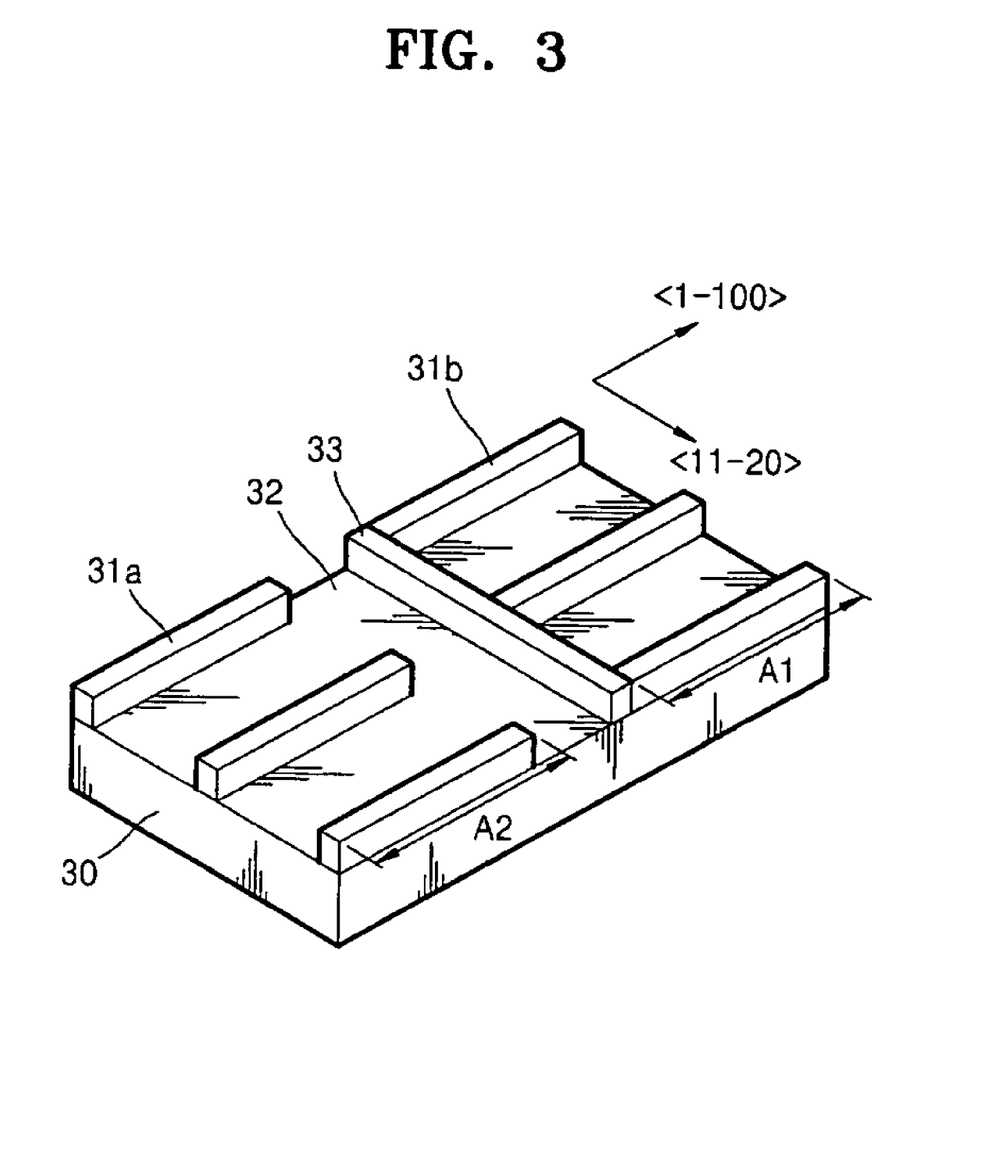
FIG. 3 is a perspective view of a Pendeo-epitaxy growth substrate according to an embodiment of the present invention.

FIG. 3 is a perspective view of a Pendeo-epitaxy growth substrate 30 according to an embodiment of the present invention. Referring to FIG. 3, the substrate 30 comprises a plurality of pattern areas 31a and 31b used to grow Pendeo-expitaxy, and a solution blocking layer 33 that contacts the plurality of pattern areas 31b. The substrate 30 can be formed of sapphire, silicon carbide, silicon, ZnO, etc. The pattern areas 31a and 31b are formed on the substrate 30 in a first direction. The solution blocking layer 33 contacts edges of the pattern areas 31b and is formed on the substrate 30 in a second direction. In detail, the first direction of the pattern areas 31a and 31b can be orthogonal to the second direction of the solution blocking layer 33. The solution blocking layer 33 can be formed in a single layer at edges of the pattern areas 31a and 31b, or in a multi-layer inside the pattern areas 31a and 31b.

When a semiconductor layer is formed on a 0001 plane of the substrate 30 as an expanded pattern part of the solution blocking layer 33, the pattern areas 31b for the Pendeo-epitaxy growth can be formed in a direction <1-100>, and the solution blocking layer 33 can be formed in another direction <11-20> that is orthogonal to the pattern areas 31b. The solution blocking layer 33 may be formed of the same material as the pattern areas 31a and 31b and may be formed during the same process as the formation of the pattern areas 31a and 31b. For convenience while performing the process, the solution blocking layer 33 can have an identical or similar width to that of the pattern areas 31a and 31b formed during the Pendeo-epitaxy growth process. In detail, the width of the solution blocking layers 33 may be more than approximately 0.01 micrometer.

A method of forming the Pendeo-epitaxy growth substrate 30 according to an embodiment of the present invention will now be described in detail.

Group III nitrides, such as GaN, AlGaN, InGaN, or AlInGaN are coated on the substrate 30. The substrate 30 can be formed of sapphire, silicon carbide, silicon, ZnO, etc., but the present invention is not restricted thereto. After coating the group III nitrides on the substrate 30, a mask having openings corresponding to the pattern areas 31a and 31b and the solution blocking layer 33 is disposed on the substrate 30. An area 32, excluding the pattern areas 31a and 31b and the solution blocking layer 33, is removed using a wet etching process or a dry etching process such as reactive ion etching, etc., to expose the facet of the substrate 30. In the Pendeo-epitaxy growth substrate 30 of the current embodiment of the present invention, the solution blocking layer 33 is simultaneously formed with the pattern areas 31a and 31b.

Figure 4A:
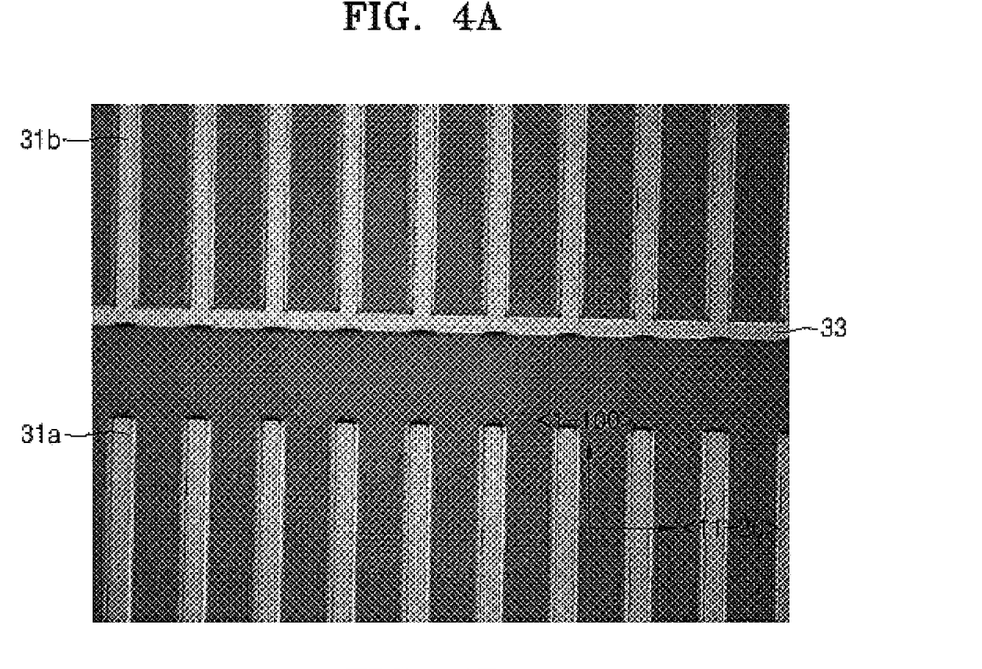
FIG. 4A is an image of a Pendeo-epitaxy growth substrate according to an embodiment of the present invention.

FIG. 4A is an image of the Pendeo-epitaxy growth substrate according to an embodiment of the present invention. Referring to FIG. 4A, the pattern areas 31a that are not used in manufacturing a semiconductor device and the pattern areas 31b that are used in manufacturing the semiconductor device are formed on the Pendeo-epitaxy growth substrate 30. The solution blocking layer 33 is formed at edges of the usable pattern areas 31b. The pattern areas 31a and 31b are formed on a 111 plane of the substrate in the direction <1-100>. The solution blocking layer 33 is formed on the 111 plane of the substrate in the direction <11-20>.

Figure 4B:
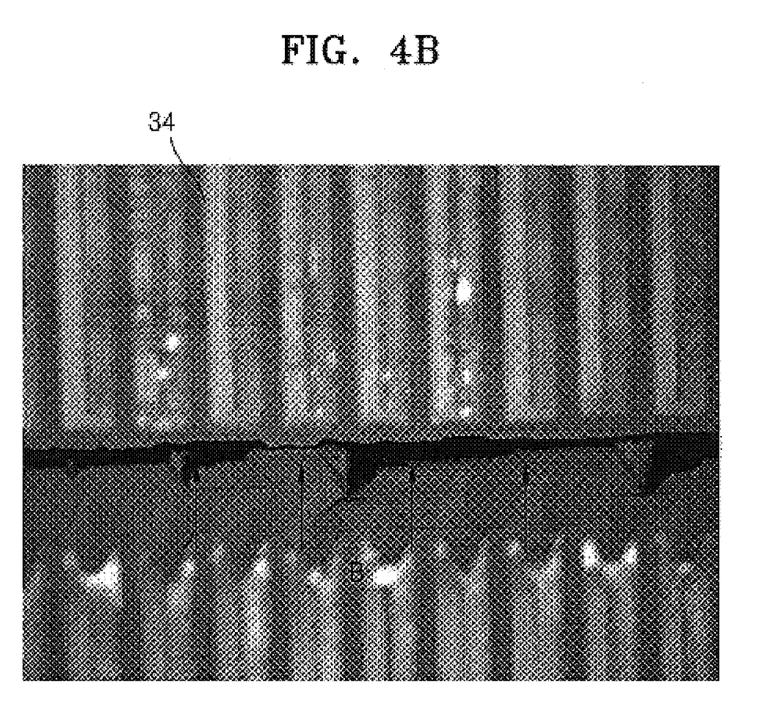
FIG. 4B is an image of a grown nitride using a Pendeo-epitaxy growth substrate according to an embodiment of the present invention.

FIG. 4B is an image of a grown nitride using a Pendeo-epitaxy growth substrate according to an embodiment of the present invention. Referring to FIG. 4B, various organic materials, acid solutions, etc., used in manufacturing the semiconductor device move through air gaps in a direction B. However, they fail to pass from a usable area A1 illustrated in FIG. 3 due to the solution blocking layer 33.

Figure 5A:
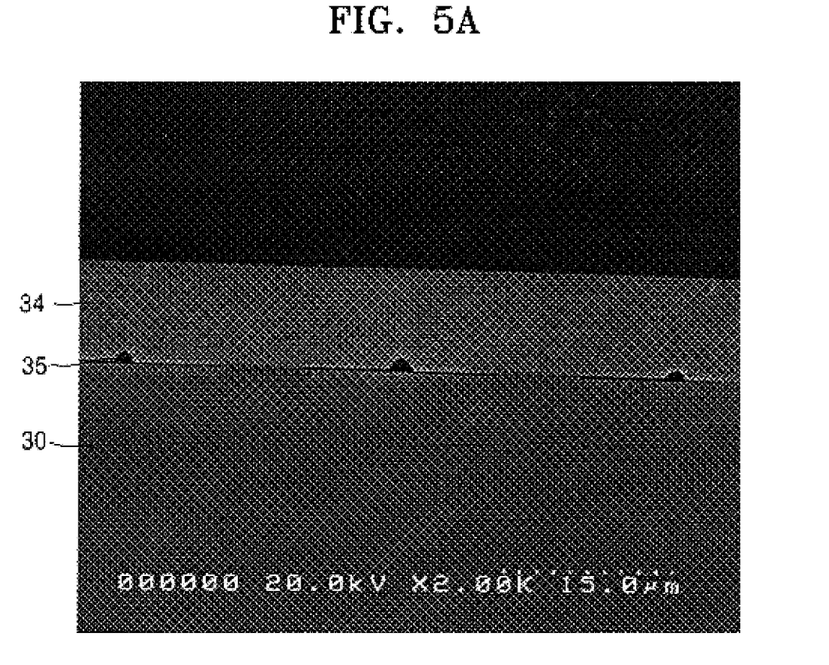
FIGS. 5A and 5B are cross-sectional images of a semiconductor device formed using a Pendeo-expitaxy growth substrate according to an embodiment of the present invention.
Figure 5B:
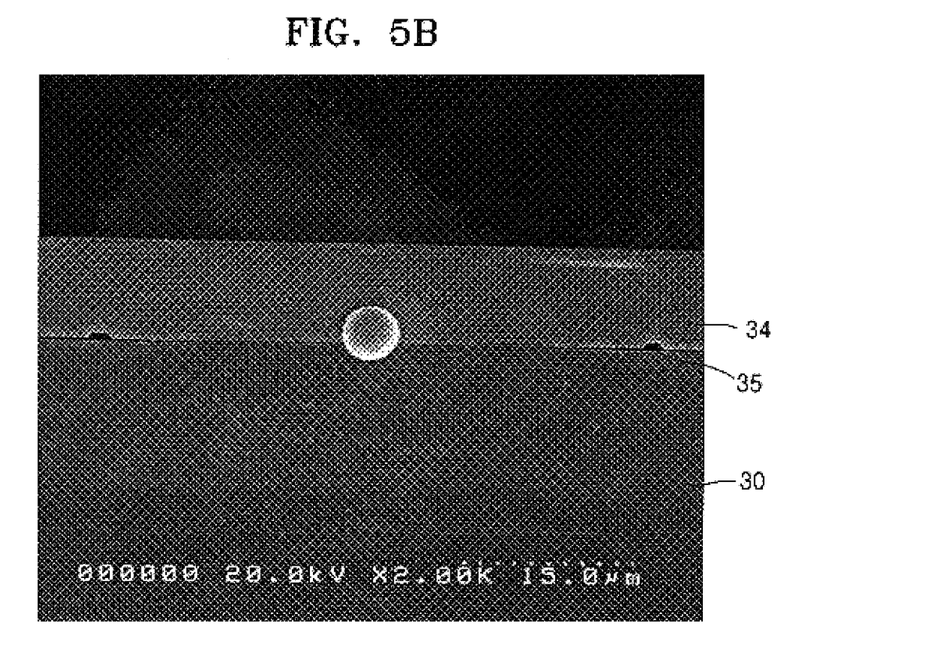

FIGS. 5A and 5B are cross-sectional images of a semiconductor device formed using a Pendeo-epitaxy growth substrate according to an embodiment of the present invention. Referring to FIGS. 5A and 5B, the usable area A1 illustrated in FIG. 3 is cross-sectioned perpendicularly to the substrate 30. Air gaps 35 still exist between the substrate 30 and the semiconductor layer 34. However, since the solution blocking layer 33 restricts a flow of various organic materials or acid solution, the substrate 30 produces a much better result than the conventional substrate illustrated in FIGS. 2A and 2B although the solution passes from some areas.

Figure 6:
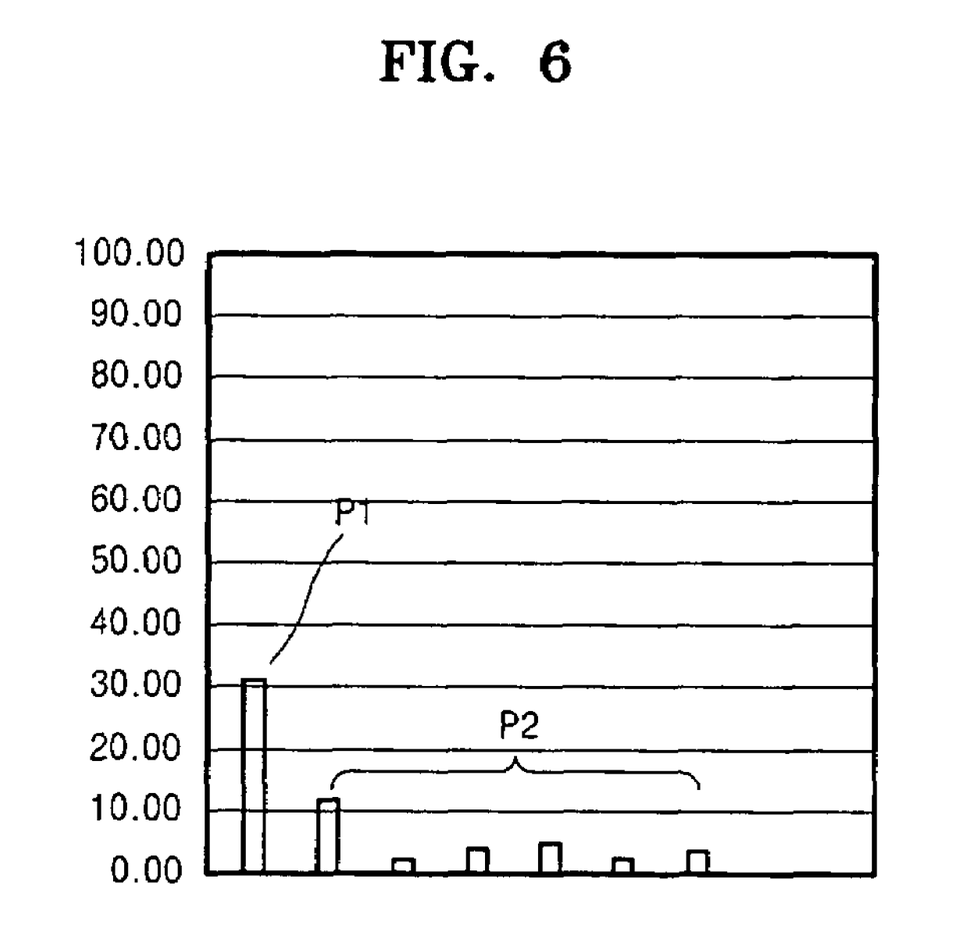
FIG. 6 is a graph of percentage defects of a sample in which a blocking solution layer is not formed and percent defects of another sample in which the blocking solution layer is formed during a Pendeo-expitaxy growth process.

FIG. 6 is a graph of percentage defects of a sample P1 in which a blocking solution layer is not formed and percentage defects of another sample P2 in which the blocking solution layer is formed during a Pendeo-epitaxy growth process. Referring to FIG. 6, a semiconductor device P2 in which the solution blocking layer is formed shows good results having low percentage defects in the range of 5% and 10%. Meanwhile, a semiconductor device P1 in which the solution blocking layer is not formed has high percentage defects of more than 30% due to contamination caused by the air gap areas. Therefore, the solution blocking layer that prevents the solution from flowing through edges of pattern areas is formed using a simple process, thereby greatly increasing the yield.

According to the present invention, a solution blocking layer that prevents the flow of solution during a manufacturing process of a semiconductor, i.e., a semiconductor luminescent device such as a laser diode, is formed after growing the semiconductor device by using a Pendeo-epitaxy process, thereby preventing contamination of the semiconductor device due to air gaps, and increasing reliability as well as greatly increasing the yield of the semiconductor device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A Pendeo-epitaxy growth substrate comprising:
   a substrate;
   a plurality of pattern areas formed in a usable area on the substrate in a first direction for Pendeo-epitaxy growth; and
   at least one solution blocking layer contacting the plurality of pattern areas and formed on the substrate in a second direction,
   wherein the solution blocking layer contacts the pattern areas only at an edge of the usable area adjacent an unusable area.

2. The Pendeo-epitaxy growth substrate of claim 1, wherein the first direction and the second direction are orthogonal to each other.

3. The Pendeo-epitaxy growth substrate of claim 1, wherein the substrate is formed of sapphire, silicon carbide, silicon, or ZnO.

4. The Pendeo-epitaxy growth substrate of claim 1, wherein the pattern areas and the solution blocking layer are formed of Group III nitrides.

5. The Pendeo-epitaxy growth substrate of claim 1, wherein the first direction is a direction <1-100>, and the second direction is a direction <11-20>.

6. The Pendeo-epitaxy growth substrate of claim 1, wherein the solution blocking layer contacts ends of the pattern areas.

7. A method of forming a Pendeo-epitaxy growth substrate, the method comprising:
   coating Group III nitrides on a substrate and forming a nitride layer;
   disposing a mask having openings corresponding to a plurality of pattern areas formed in a usable area on the substrate in a first direction for Pendeo-epitaxy growth and at least one solution blocking layer contacting the plurality of pattern areas and formed on the substrate in a second direction on the nitride layer; and
   patterning the nitride layer excluding the pattern areas and the solution blocking layer and removing the etched nitride layer,
   wherein the solution blocking layer contacts the pattern areas only at an edge of the usable area adjacent an unusable area.

8. The method of claim 7, wherein the first direction and the second direction are orthogonal to each other.

9. The method of claim 7, wherein the substrate is formed of sapphire, silicon carbide, silicon, or ZnO.

10. The method of claim 7, wherein the Group III nitrides are GaN, AlGaN, InGaN, or AlInGaN.

11. The method of claim 7, wherein the solution blocking layer contacts the ends of the pattern areas.

12. The method of claim 4, wherein the group Group III nitrides are GaN, AlGaN, InGaN, or AlInGaN.

* * * * *